(12) United States Patent
Lee et al.

(10) Patent No.: US 8,062,981 B2
(45) Date of Patent: Nov. 22, 2011

(54) METHOD OF FORMING PATTERN USING FINE PITCH HARD MASK

(75) Inventors: Ji-young Lee, Yongin-si (KR);
Sang-gyun Woo, Yongin-si (KR);
Joon-soo Park, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 443 days.

(21) Appl. No.: 12/327,006

(22) Filed: Dec. 3, 2008

(65) Prior Publication Data
US 2009/0117497 A1     May 7, 2009

Related U.S. Application Data

(63) Continuation of application No. 11/367,437, filed on Mar. 6, 2006, now Pat. No. 7,473,647.

(30) Foreign Application Priority Data

Apr. 19, 2005  (KR) .......................... 10-2005-0032297

(51) Int. Cl.
*H01L 21/302* (2006.01)
(52) U.S. Cl. .......................... 438/717; 438/725; 438/736
(58) Field of Classification Search .................. 438/303, 438/309, 706, 710, 717, 725, 736; 216/41, 216/47
See application file for complete search history.

(56) References Cited

U.S. PATENT DOCUMENTS

| | | | |
|---|---|---|---|
| 5,679,591 A * | 10/1997 | Lin et al. ....................... | 438/257 |
| 6,239,008 B1 | 5/2001 | Yu et al. | |
| 6,380,042 B1 * | 4/2002 | Huang ........................... | 438/303 |
| 6,403,417 B1 | 6/2002 | Chien et al. | |
| 7,256,126 B1 | 8/2007 | Chen | |
| 2003/0027420 A1 | 2/2003 | Lai et al. | |
| 2003/0207584 A1 | 11/2003 | Sivakumar et al. | |
| 2004/0017989 A1 | 1/2004 | So | |
| 2006/0046484 A1 | 3/2006 | Abatchev et al. | |
| 2006/0263699 A1 | 11/2006 | Abatchev et al. | |

FOREIGN PATENT DOCUMENTS

| | | |
|---|---|---|
| JP | 01-140629 | 6/1989 |
| JP | 02-266517 | 10/1990 |
| JP | 05-088375 | 4/1993 |
| JP | 10-144660 | 5/1998 |
| KR | 100155880 B1 | 7/1998 |
| KR | 100165399 B1 | 9/1998 |

OTHER PUBLICATIONS

Japanese Office Action dated Aug. 30, 2011.

* cited by examiner

*Primary Examiner* — Lan Vinh
(74) *Attorney, Agent, or Firm* — Volentine & Whitt, PLLC

(57) ABSTRACT

A method of forming a fine pattern of a semiconductor device using a fine pitch hard mask is provided. A first hard mask pattern including first line patterns formed on an etch target layer of a substrate with a first pitch is formed. A first layer including a top surface where a recess is formed between adjacent first line patterns is formed. A second hard mask pattern including second line patterns within the recess is formed. An anisotropic etching process is performed on the first layer using the first and the second line patterns as an etch mask. Another anisotropic etching process is performed on the etch target layer using the first and the second hard mask patterns as an etch mask.

20 Claims, 10 Drawing Sheets

METHOD OF FORMING PATTERN USING FINE PITCH HARD MASK

CROSS-REFERENCE TO RELATED APPLICATION

This application is a divisional of application Ser. No. 11/367,437 filed on Mar. 6, 2006, the subject matter of which is hereby incorporated by reference.

BACKGROUND

1. Field of the Invention

Embodiments of the invention relate to a method of fabricating a semiconductor device. More particularly, embodiments of the invention relate to a method of forming a fine pattern on a substrate using a fine pitch hard mask.

This application claims the benefit of Korean Patent Application No. 10-2005-0032297 filed on Apr. 19, 2005, the subject matter of which is hereby incorporated by reference in its entirety.

2. Description of Related Art

Large scale integration of semiconductor devices has generally required the use of micronized patterns. Individual devices must be micronized in order to integrate a great multiplicity of devices within a limited area. As a result, it is commonly necessary to scale down the pitch of various patterns used to form the devices. As the design rules for semiconductor devices have rapidly shifted towards micronization, it has become increasingly difficult to form sufficiently fine pitch patterns due to the resolution limitations of conventional photolithography processes used to form the patterns. However, such very fine line and space patterns (hereinafter referred to as "L/patterns") are necessary to the implementation of contemporary and emerging semiconductor devices on various substrate materials.

Among the various methods proposed to improve the resolution of conventional photolithography processes, one method suggests patterning an etch target layer using a hard mask spacer pattern. In particular, the spacer pattern may be formed using a specific method, such as the one disclosed, for example, in U.S. Pat. No. 6,603,688, which is adapted to the formation of a spacer having small feature sizes.

However, if this type of spacer pattern is used as the hard mask, the thickness of each one of a paired set of spacers formed on sidewalls of a particular pattern will generally be non-uniform. Hence, it is typical to form a spacer thicker than its intended pattern thickness in order to obtain uniformity of the thickness for paired spacers. This thickened spacer also makes it difficult to remove the spacer pattern after the spacer pattern is used as the hard mask. Since the aforementioned hard mask is formed by encompassing both sidewalls of the aforementioned particular pattern by the pair of spacers, when forming line patterns using the spacers, an additional trimming process is generally required to separate the spacers into an individual line pattern.

When patterns must be formed in one region having a relatively high pattern density—for instance, a cell array region in a semiconductor substrate, and in another region having a relatively low pattern density—for instance, a peripheral or core region it may be necessary in view of the foregoing limitations to form these respective patterns separately. That is, when it is necessary to form desired patterns having very different pitches, as between different regions of a substrate, it is often necessary to form these different pattern pitches separately. This requirement further complicates the process of fabricating semiconductor devices on substrates and tends to drive up the associated costs and risks of patterning errors.

SUMMARY

Embodiments of the invention provide a method of forming a fine pitch pattern which overcomes the resolution limitations associated with conventional photolithography processes.

Embodiments of the invention also provide a method of forming a fine pattern on a substrate, wherein the pattern may have different sizes and pitches and yet be formed using a single method. That is, the different regions of the pattern having different pitches may be simultaneously formed on a substrate.

According to an embodiment of the invention, there is provided a method of forming a fine pattern of a semiconductor device, including: forming a first hard mask pattern including a plurality of first line patterns formed on an etch target layer of a substrate in a first direction with a first pitch; forming a first layer covering sidewalls and an upper surface of the first hard mask pattern such that the first layer includes a top surface where a recess is formed between two adjacent first line patterns; forming a second hard mask pattern including a plurality of second line patterns each extending in the first direction within the recess; performing an anisotropic etching process on the first layer using the first line patterns and the second line patterns as an etch mask, thereby exposing the etch target layer disposed between the first line patterns and the second line patterns; and performing another anisotropic etching process on the etch target layer using the first hard mask pattern and the second hard mask pattern as an etch mask.

During the formation of the first layer, a plurality of the recesses may be formed on the top surface of the first layer, and the second line patterns may be formed preferably within a group of the recesses selected among the plurality of the recesses.

The forming of the second hard mask pattern may include forming a second layer having a different etch selectivity ratio from that of the first layer on the first layer, and forming the second line patterns each of which being a remaining portion of the second layer within the recess by removing a portion of the second layer. The portion of the second layer may be removed using a wet etch method.

In the forming of the first layer, the plurality of the recesses may be formed on the top surface of the first layer and the second layer may be completely removed within a group of the recesses selected from the plurality of recesses during the removal of the portion of the second layer.

The first line patterns and the second line patterns may be used to form a plurality of line and space patterns each with a pitch that is one half of the first pitch on the substrate.

The first hard mask pattern may include a third layer and a fourth layer sequentially formed on the etch target layer. The second line patterns may be formed at the same surface level as the fourth layer.

The fourth layer and the second line patterns may be formed of the same material or different material with a similar etch characteristic.

The first layer and the third layer may be formed of the same material or different material with a similar etch characteristic.

According to the embodied fine pattern formation method, fine patterns overcoming the limitation of resolution in the conventional photolithography process can be easily implemented. Also, widely ranged pitches and sizes of various patterns can be simultaneously formed through a simplified process without being affected by a pattern density difference.

BRIEF DESCRIPTION OF THE DRAWINGS

The above and other features and advantages of the present invention will become more apparent upon consideration of several exemplary embodiments thereof with reference to the attached drawings in which.

DESCRIPTION OF EMBODIMENTS

Figure 1A:
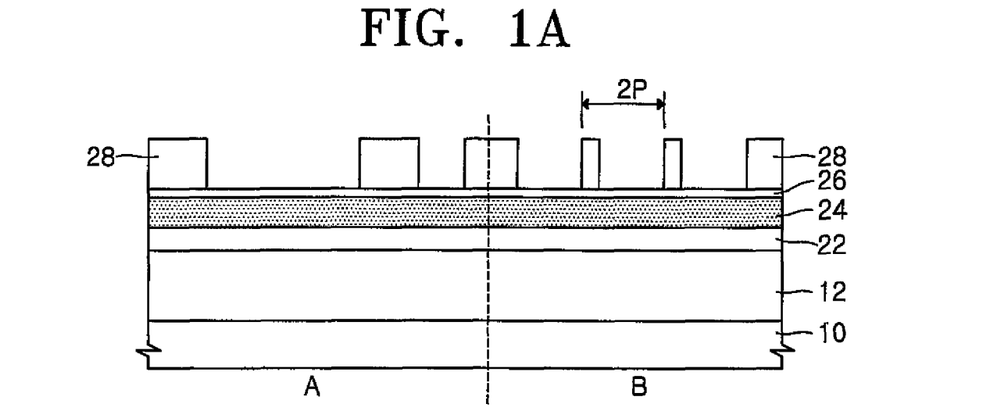
FIGS. 1A through 1F are cross-sectional views of a substrate with fine patterns formed thereon in accordance with an embodiment of the invention.
Figure 1B:
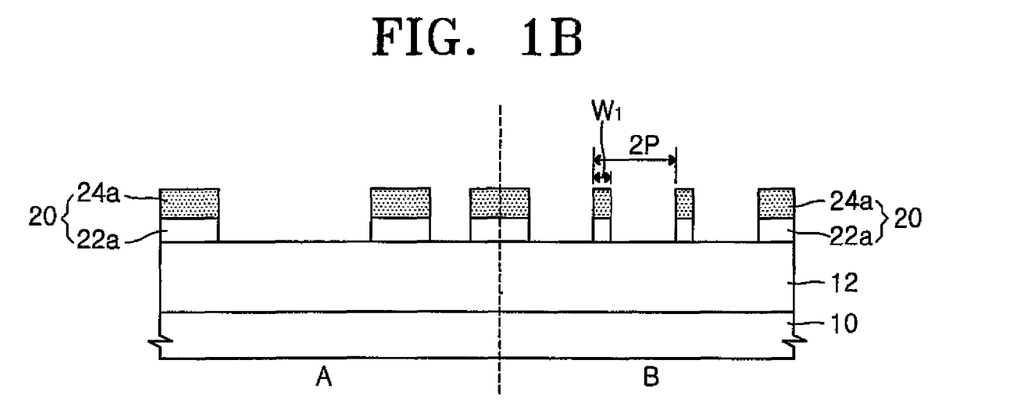
Figure 1C:
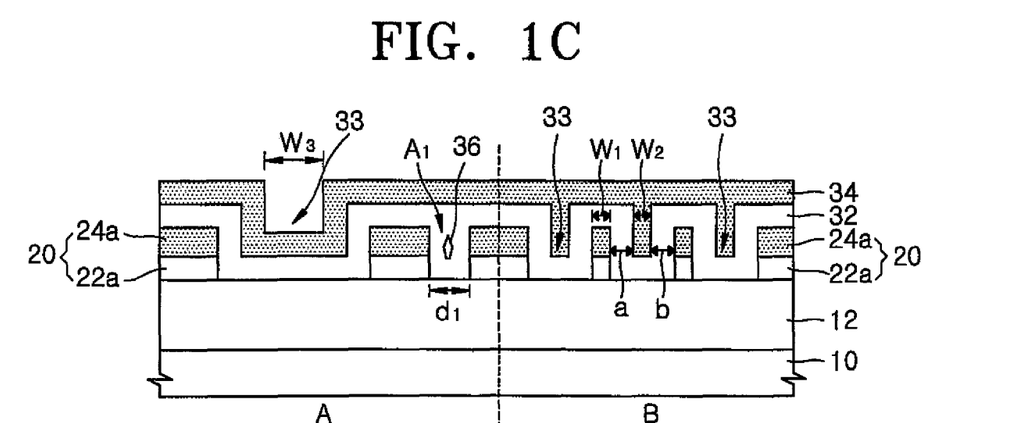
Figure 1D:
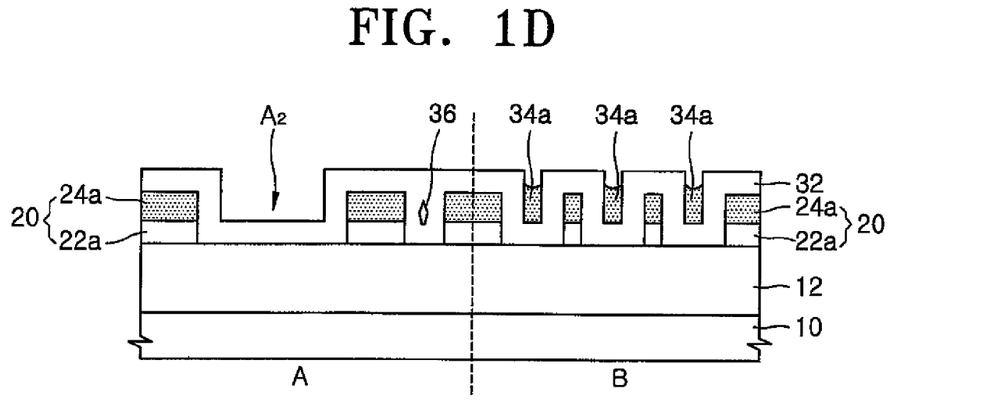
Figure 1E:
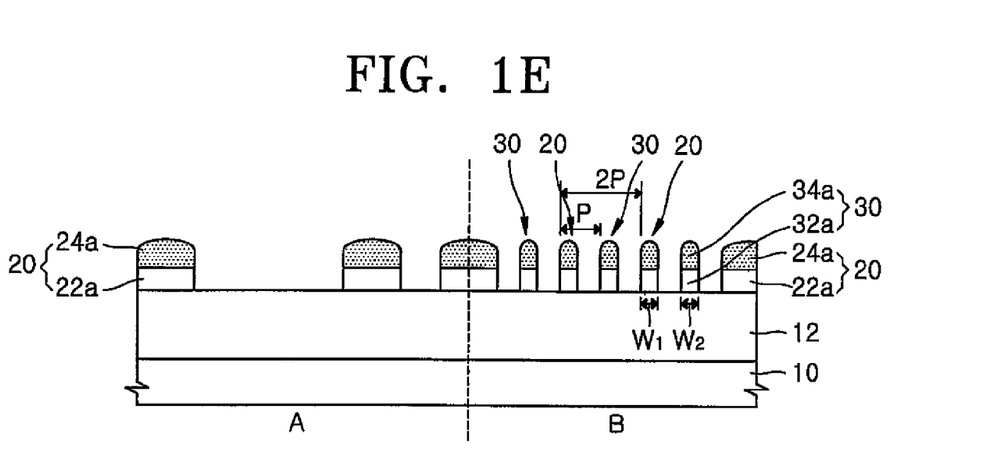
Figure 1F:
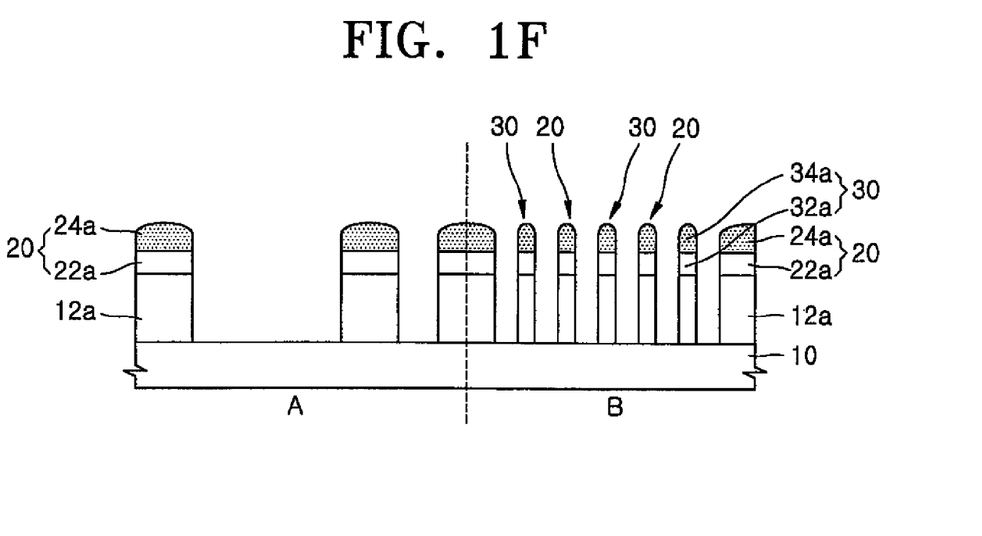

FIGS. 1A and 1F are cross-sectional views of an exemplary substrate on which fine patterns are formed using fine pitch hard mask patterns provided by one embodiment of the invention.

Referring to FIG. 1A, an etch target layer 12, a first mask layer 22 and a second mask layer 24 are sequentially formed on a substrate 10. The etch target layer 12 may be formed from various materials depending on the particular use of the patterns. For instance, when defining an active region on a semiconductor substrate, the etch target layer 12 may be formed of silicon. When forming a gate electrode, the etch target layer 12 may be formed of a conductive material, such as doped polysilicon or a stacked structure including doped polysilicon and a metal silicide. When forming a bit line, the etch target layer 12 may be formed of a metal or metal alloy, such as tungsten or aluminum.

The first mask layer 22 serves as a buffer for obtaining a uniform thickness of the second mask layer 24, which is to be used as a hard mask. The first mask layer 22 and the second mask 24 use materials having different etch characteristics. That is, the materials used to form the first mask layer 22 and second mask layer 24 should have different etch selectivity ratios with respect to a predetermined etch solution. In particular, the material used to form the second mask layer 24 should have a relatively higher etch selectivity ratio than that of the material(s) used to form the etch target layer 12 and first mask layer 22.

For example, the first mask layer 22 may be formed from a material selected from the group consisting of a thermal oxide, a chemical vapor deposition (CVD) oxide, undoped silicate glass (USG), and/or a high density plasma (HDP) oxide. Also, the first mask layer 22 may be formed of a nitride-based material selected from the group consisting of SiON, SiN, SiBN and BN.

Of note, however, HDP oxides, at least when deposited in a large-size line pattern, are frequently deposited with an uneven or mountain shape having a protruding peak. Therefore, the use of HDP oxide may not be appropriate in some applications of the invention. When used, an HDP oxide is preferably used in applications where the deposition characteristics (e.g., the deposition profile) of the HDP oxide will not cause a problem during subsequent process steps.

If the first mask layer 22 is an oxide-based layer, the second mask layer 24 may be formed from a material selected from the group consisting of polysilicon and nitride-based materials including SiON, SiN, SiBN and BN. If the first mask layer 22 is formed from a nitride-based layer, the second mask layer 24 may be formed of an oxide having good planarization characteristics. In this regard, exemplary oxide materials for the second mask layer 24 include SOG and flowable oxide (FOX). If the second mask layer 24 is an oxide layer, it may not be appropriate to use the second mask layer 24 as a hard mask depending on which material is used to form the etch target layer 12. Thus, a choice of materials for the first mask layer 22 and the second mask layer 24 will be made within the designer's discretion in accordance with a choice of material (s) for the etch target layer 12.

An anti-reflective coating layer 26 may be formed on the second mask layer 24, and afterwards, photoresist patterns 28 are formed on the anti-reflective coating layer 26. In some cases, the formation of the anti-reflective coating layer 26 may be omitted. In a low density pattern region "A" of substrate 10 where device elements are relatively widely arranged per unit area (e.g., a peripheral region or a core region), the individual photoresist pattern 28 is formed having a pitch that is identical to the intended pitch of the hard mask pattern. Also, in a high density pattern region "B" of substrate 10 where device elements are relatively narrowly arranged per unit area (e.g., cell array region), the individual photoresist pattern 28 is formed with a first pitch having twice (2P) the intended pitch of the hard mask pattern.

Referring to FIG. 1B, the second mask layer 24 and the first mask layer 22 are subjected to an anisotropic etching process using the photoresist patterns 28 as an etch mask, thereby providing a plurality of first hard mask patterns 20 each including a first mask pattern 22a and a second mask pattern 24a. Afterwards, the photoresist patterns 28 and the anti-reflective coating layer 26 are removed.

In the low density pattern region "A", the individual first hard mask pattern 20 has the same shape as that of the photoresist pattern 28 with a pitch (P) identical to that of the intended hard mask pattern. On the other hand, in the high density pattern region "B", the individual first hard mask pattern 20 has first pitch (2P) which is twice that of the intended hard mask pattern. In one embodiment, a width ($W_1$) of the individual first hard mask pattern 20 in the high density pattern region "B" is one quarter of the first pitch (2P). As illustrated in FIG. 1B, the first hard mask patterns 20 may be formed in line patterns arranged on the substrate 10 in a predetermined direction with the first pitch (2P).

Referring to FIG. 1C, a third mask layer 32 and a fourth mask layer 34 are formed on the first hard mask patterns 20 and the substrate 10. (In this context the term "on" denotes one layer being formed directly on another layer or element, or one layer being formed on another layer or element with intervening layers or elements being present). The third mask layer 32 may be formed of a material having similar etch characteristics to that of the material used to form the first mask layer 22. The third mask layer 32 may be formed of the same material used to form the first mask layer 22 or of a different material having similar etch characteristics. For instance, the first mask layer 22 may be formed of a thermal oxide and the third mask layer 32 may be formed of a CVD oxide, or vice versa.

The fourth mask layer 34 may be formed of a material having similar etch characteristics to that of the material used to form the second mask layer 24. The fourth mask layer 34 may be formed of the same material used to form the second mask layer 24 or of a different material having similar etch characteristics. For instance, the second mask layer 24 may be formed of a nitride and the fourth mask layer 34 may be formed of polysilicon, or vice versa.

The portion of third mask layer 32 from on the high density pattern area "B" is formed with a uniform thickness on the sidewalls and top surfaces of the first hard mask patterns 20. In the embodiment illustrated in FIG. 1C, each of thicknesses "a" and "b" of the third mask layer 32 covering sidewalls of the individual first hard mask pattern 20 is one quarter of the first pitch (2P). That is, each one of the thicknesses "a" and "b" of the third mask layer 32 will be identical to the width ($W_1$) of the individual first hard mask pattern 20.

In the high density pattern region "B", a plurality of recesses 33 are generated on predetermined top surfaces of the third mask layer 32 each defined between the first hard mask patterns 20. Since the fourth mask layer 34 is formed of a material having good planarization characteristics, the fourth mask layer 34 fills the recesses 33. When each of the thicknesses "a" and "b" of the third mask layer 32 is one quarter of the first pitch (2P), a width ($W_2$) of the fourth mask layer 34 in an individual recess 33 is one quarter of the first pitch (2P). That is, the width ($W_2$) of the fourth mask layer 34 will be the same as width ($W_1$) of the first hard mask pattern 20. The fourth mask layer 34 also extends within the recesses 33 in the same direction as the direction in which the first hard mask pattern 20 extends.

In the low density pattern region "A", if a distance between two adjacent first hard mask patterns 20 is small, that is, as marked with a reference denotation "$A_1$" in FIG. 1C, if the distance "$d_1$" between the two adjacent first hard mask patterns 20 is less than the sum of the thicknesses "a" and "b" of the third mask layer 32, (i.e., $D_1 \leq a+b$), the recess is not formed on the top surface of the third mask layer 32. On some occasions, if the distance "$d_1$" between the two adjacent first hard mask patterns 20 is less than the sum of the thicknesses "a" and "b" of the third mask layer 32, and the third mask layer 32 is formed over the first hard mask patterns 20, a void 36 may be generated between the two adjacent first hard mask patterns 20.

Referring to FIG. 1D, predetermined portions of the fourth mask layer 34 may be selectively removed using a wet etch method. If the fourth mask layer 34 is formed from a nitride-based material, phosphoric acid may be used as an etch solution. If the fourth mask layer 34 is formed from an oxide-based material, an etch solution selected from the group consisting of fluoric acid, sulfuric acid, standard cleaning (SC)-1, and LAL may be used.

As a result of the wet etching of the fourth mask layer 34, a plurality of fourth mask patterns 34a, which are remaining portions of the fourth mask layer 34, are formed in line patterns extending within the recesses 33 in the same direction as the first hard mask patterns 20. An individual fourth mask pattern 34a is disposed approximately at the same surface level as an individual second mask pattern 24a.

In the low density pattern region "A", as represented with a reference denotation "$A_2$", if a width of the recess 33 formed on the top surface of the third mask layer 32 illustrated in FIG. 1D is relatively larger, the fourth mask layer 34 disposed within the recess 33 is completely removed by the wet etch method.

In particular, the width "$W_3$" of the recess 33 exposed after the deposition of the fourth mask layer 34 in the low density pattern region "A" is greater than approximately 10 nm, and the removal of the fourth mask layer 34 within the recess 33 was verified through repetitive experiments. Also, as illustrated in FIG. 1C, the width "$W_2$" of the individual recess 33 formed on the top surface of the third mask layer 32 in the high density pattern region "B" is less than approximately 20 nm, and experimental data verified that the fourth mask patterns 34a were formed within the respective recesses 33 with difficulty. It was further verified that the fourth mask patterns 34a were formed within regions where a distance between two adjacent first hard mask patterns 20 was less than approximately 200 nm.

Referring to FIG. 1E, another anisotropic etching process is performed on the third mask layer 32 using the individual second mask pattern 24A and the fourth mask pattern 34a as an etch mask. As a result of the anisotropic etching process, the etch target layer 12 is exposed. In particular, in the low density pattern region "A", the anisotropic etching process exposes those portions of the etch target layer 12 disposed between the first hard mask patterns 20. In the high density pattern region "B", this anisotropic etching process forms a plurality of second hard mask patterns 30 each including a third mask pattern 32a and the fourth mask pattern 34a and, exposes those portions of the etch target layer 12 disposed between the first hard mask pattern 20 and the second hard mask pattern 30. Preferably, the second hard mask pattern 30 has a width that is one quarter of the first pitch (2P). That is, the width of the second hard mask patterns 30 is identical to the width ($W_1$) of the first hard mask pattern 20. Also, the first hard mask patterns 20 and the second hard mask patterns 30 result in formation of L/S patterns on the substrate 10, wherein the L/S patterns have a pitch which is one half of the first pitch (2P).

Referring to FIG. 1F, the etch target layer 12 is subjected to an anisotropic dry etching process using the first hard mask patterns 20 and the second hard mask patterns 30 as an etch mask, thereby obtaining a plurality of fine patterns 12a. In FIG. 1F, the second mask patterns 24a and the third mask patterns 34a are illustrated as being partially consumed during the anisotropic dry etching process.

In the low density pattern region "A", the first hard mask patterns 20 are used to pattern the etch target layer 12, whereas in the high density pattern region "B", the first hard mask patterns 20 and the second hard mask patterns 30 are used to pattern the etch target layer 12. Hence, the fine pitch patterns that can overcome a resolution limitation of the photolithography process can be formed in the high density pattern region B without difficulty.

FIGS. 2A through 2D are SEM images illustrating a semiconductor device with fine patterns formed according to sequential operations of one embodiment of the invention.

These images illustrate that an etch target layer includes a silicon layer, and hard mask patterns including a CVD oxide layer and a polysilicon layer which are sequentially stacked on the etch target layer are used as an etch mask to pattern the etch target layer.

Figure 2A:
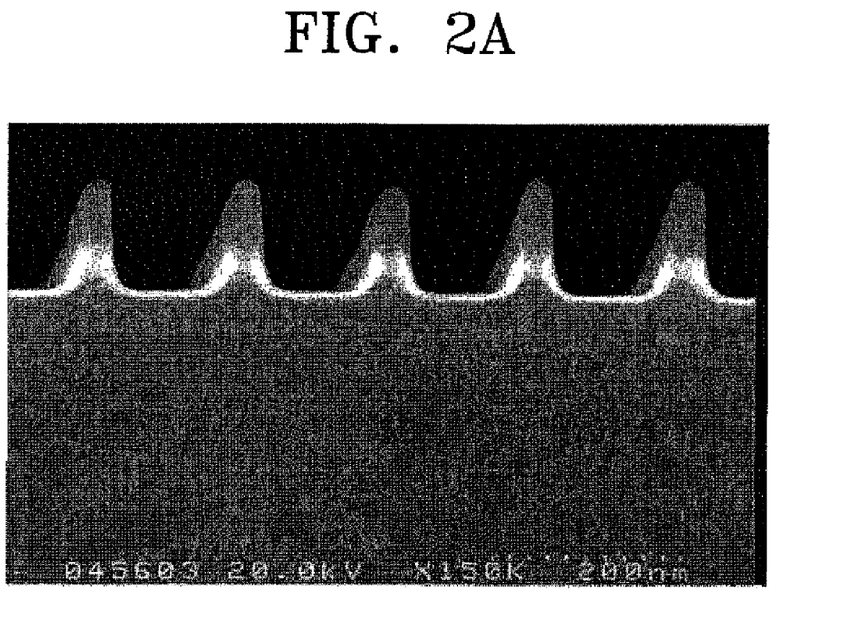
FIGS. 2A through 2D are scanning electron microscope (SEM) images illustrating fine patterns formed by sequential operations according to an embodiment of the invention.

In more detail, approximately 3000 Å of the CVD oxide layer and approximately 1000 Å of the polysilicon layer are sequentially formed on the silicon layer, i.e., the etch target layer, and afterwards, the polysilicon layer and the CVD oxide layer are anisotropically etched using photoresist patterns as an etch mask, thereby forming a plurality of first hard mask patterns. In FIG. 2A, a width of an individual first hard mask pattern was verified to be approximately 40 nm.

FIG. 2A is an SEM image illustrating a cross-sectional view of the first hard mask patterns and the photoresist patterns remaining on the first hard mask patterns according to the one embodiment of the invention. Each of the first hard mask patterns has a pitch of approximately 160 nm on the silicon layer.

Figure 2B:
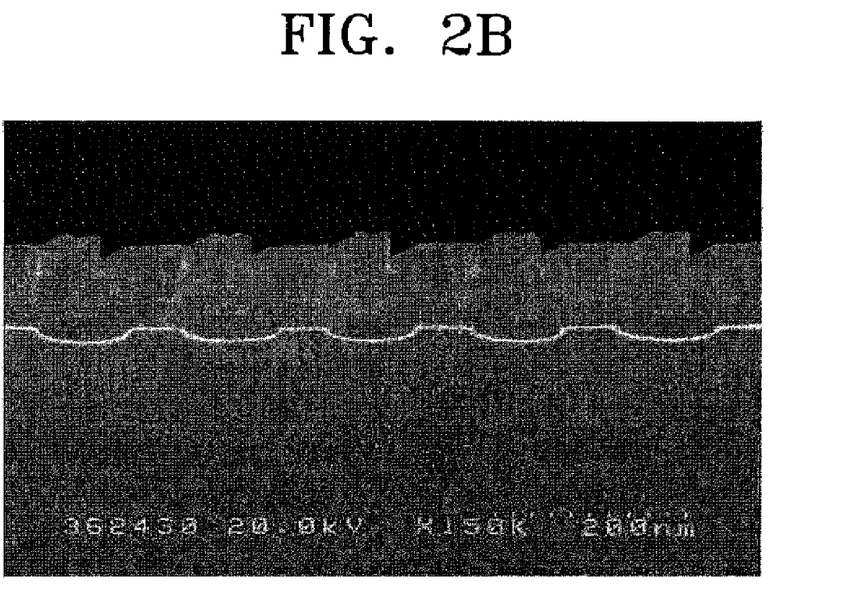

FIG. 2B is an SEM image illustrating a cross-sectional view of a structure in which the polysilicon layer of the individual first hard mask pattern is exposed according to one embodiment of the invention. This resulting structure is obtained by sequentially forming approximately 400 Å of another CVD oxide layer and approximately 500 Å of another polysilicon layer on the first hard mask patterns and removing the aforementioned other polysilicon layer via a wet etch method to expose the polysilicon layer of the first hard mask pattern.

Figure 2C:
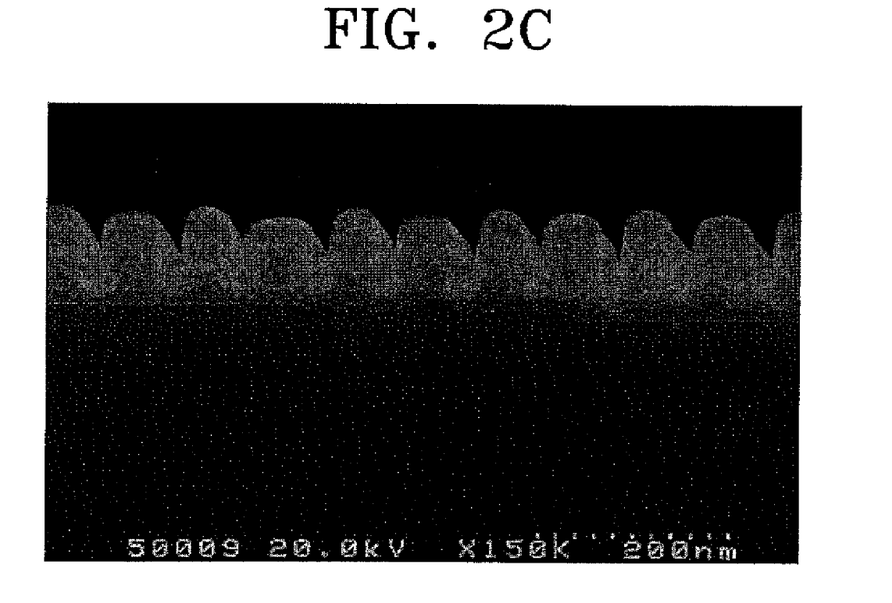

FIG. 2C is an SEM image illustrating a cross-sectional view of a structure in which the silicon layer is exposed at the same time as second hard mask patterns are formed between the first hard mask patterns. In particular, this resulting structure is obtained by performing an anisotropic etching process on the aforementioned other CVD oxide layer using the exposed polysilicon layer as an etch mask.

Figure 2D:
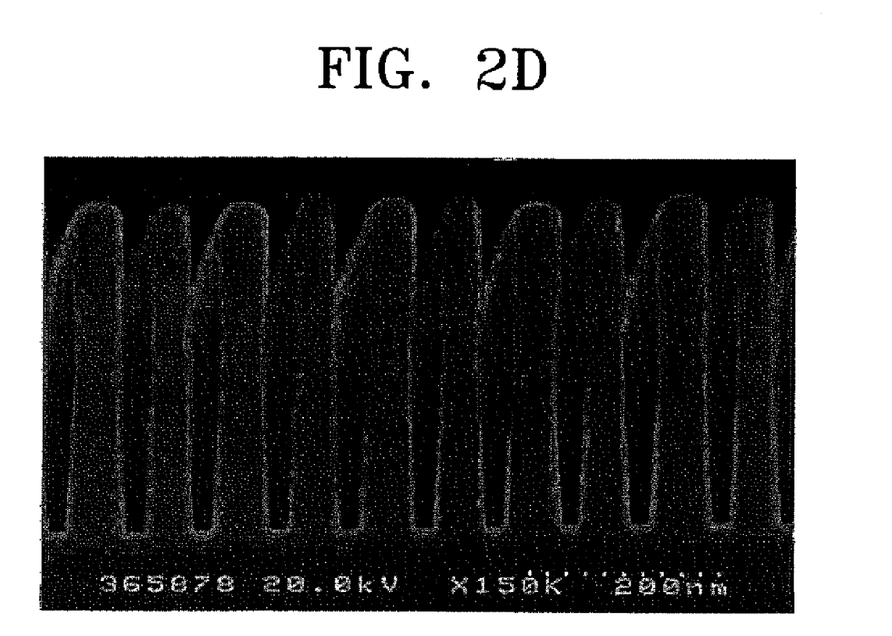

FIG. 2D is an SEM image illustrating a resulting structure obtained as an anisotropic dry etching process is performed on the silicon layer using the first hard mask patterns and the second hard mask patterns as an etch mask. FIG. 2D verifies that each of the silicon patterns obtained via the anisotropic dry etching process comprises approximately 80 nm of an L/S pattern.

Figure 3A:
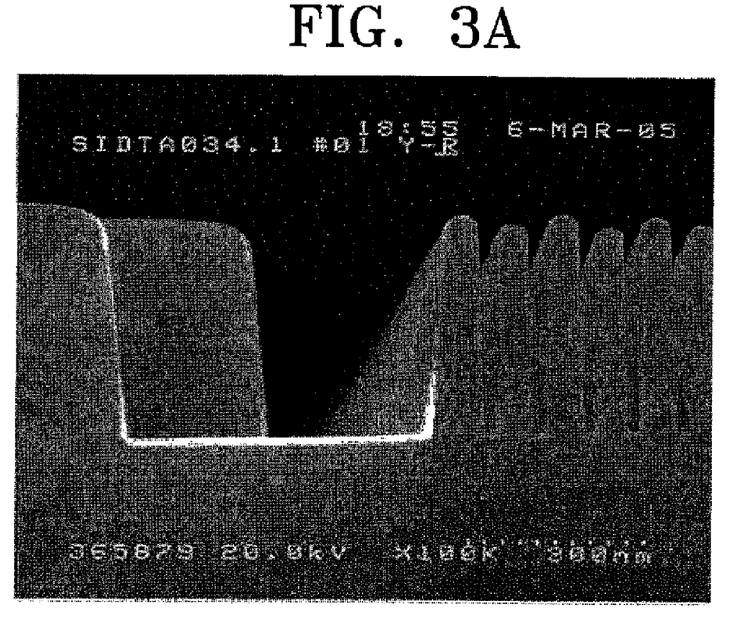
FIGS. 3A and 3B are SEM images illustrating exemplary fine patterns formed on a substrate according to a specifically embodied fine pattern formation method of the present invention.
Figure 3B:
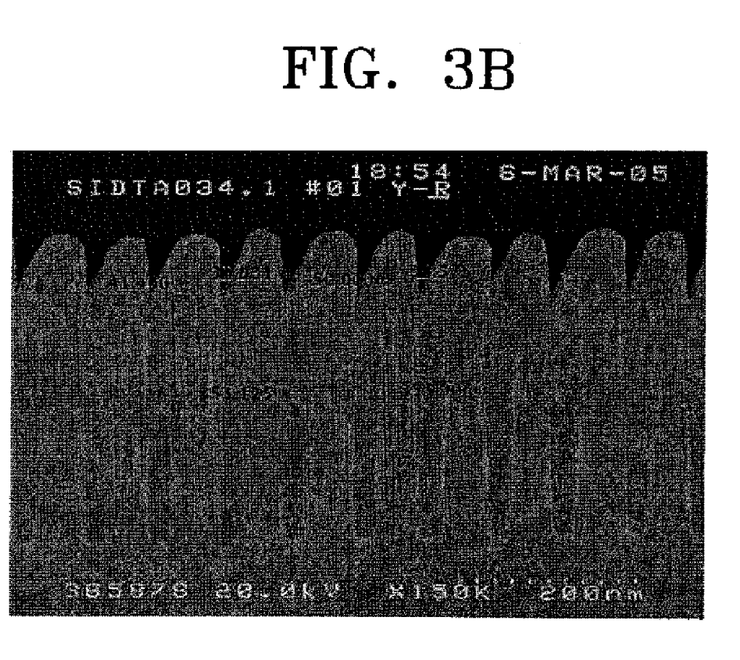

FIGS. 3A and 3B are SEM images illustrating exemplary fine patterns formed on a substrate similar to the sequential operations of the embodiment described in FIGS. 2A through 2D.

FIG. 3A is an SEM image illustrating a cross-sectional view of a resulting structure in which fine patterns are formed on a substrate defined with a high density pattern region and a low density pattern region according to the embodied fine pattern formation method described in FIGS. 2A through 2D. In the low density pattern region, since second hard mask patterns are formed, first hard mask patterns are used to pattern an etch target layer. In the high density pattern region, fine L/S patterns with micronized pitches are formed using the first hard mask patterns and the second hard mask patterns.

FIG. 3B is an SEM image illustrating an enlarged cross-sectional view of the high density pattern region. As illustrated, the L/S patterns are obtained as lines with a width range of approximately 41 nm to 50 nm and spaces with a width range of approximately 32 nm to 35 nm and arranged consecutively and repeatedly.

Figure 4A:
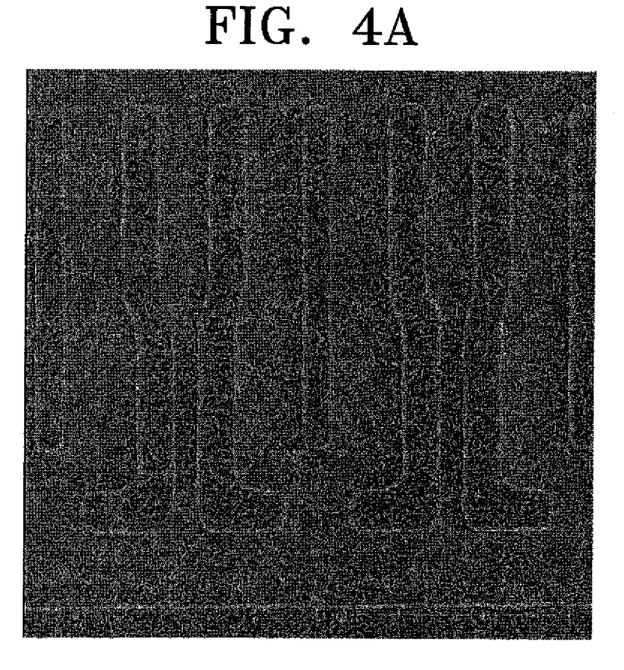
FIGS. 4A and 4B, 5A and 5B, and 6A and 6B are SEM images illustrating resulting structures including first hard mask patterns arranged in various layouts and second hard mask patterns formed in a spacer region created between the first hard mask patterns according to another embodiment of the invention.
Figure 4B:
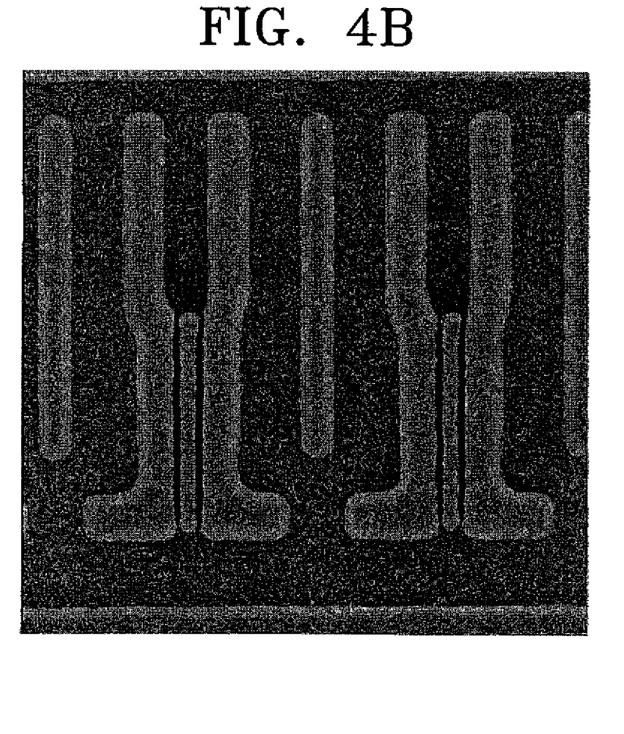
Figure 5A:
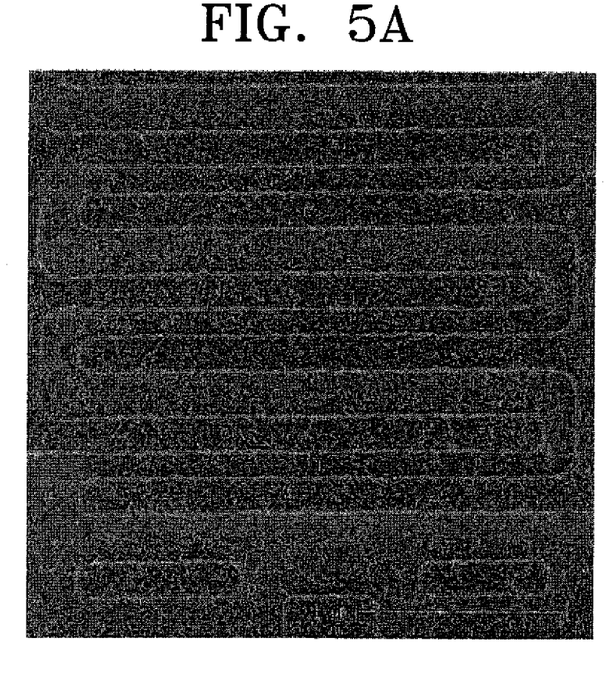
Figure 5B:
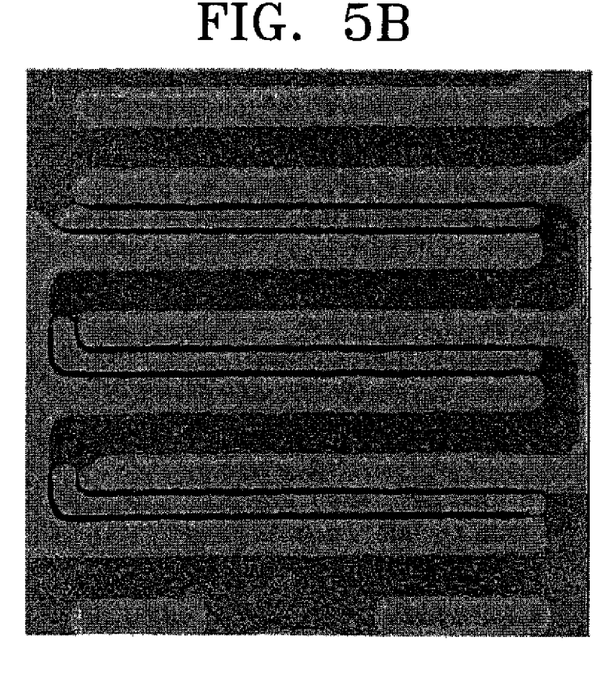
Figure 6A:
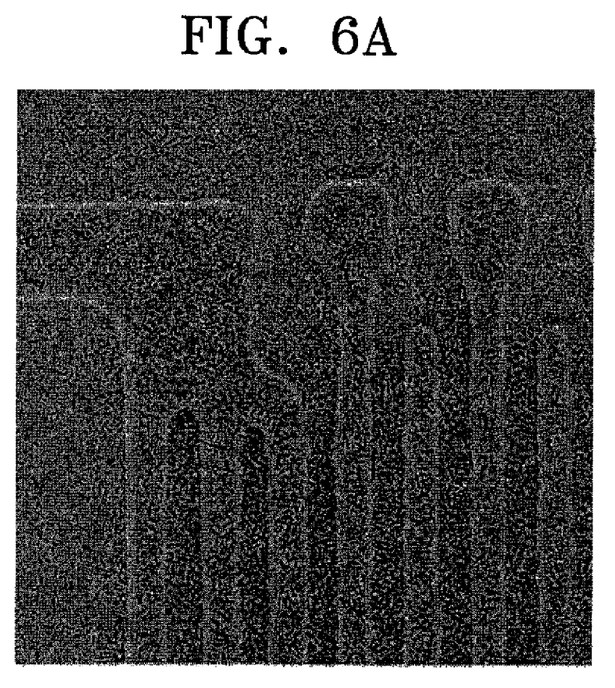
Figure 6B:
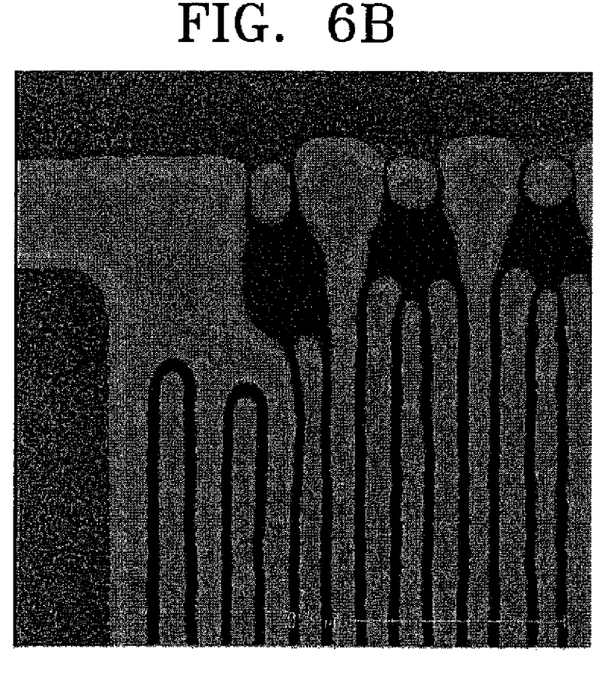

FIGS. 4A and 4B, 5A and 5B, and 6A and 6B are SEM images illustrating top views of resulting structures including first hard mask patterns arranged in various layouts and second hard mask patterns formed in space regions defined between the first hard mask patterns. In particular, FIGS. 4A, 5A and 6A illustrate the first hard mask patterns, and FIGS. 4B, 5B and 6B illustrate the second hard mask patterns.

As illustrated in FIGS. 4B, 5B and 6B, among the space regions defined between the first hard mask patterns illustrated in FIGS. 4A, 5A and 6A, the second hard mask patterns are formed in the aforementioned space regions each with a width that is less than a predetermined value, but are not formed in those space regions each with a width greater than the predetermined value.

Figure 7:
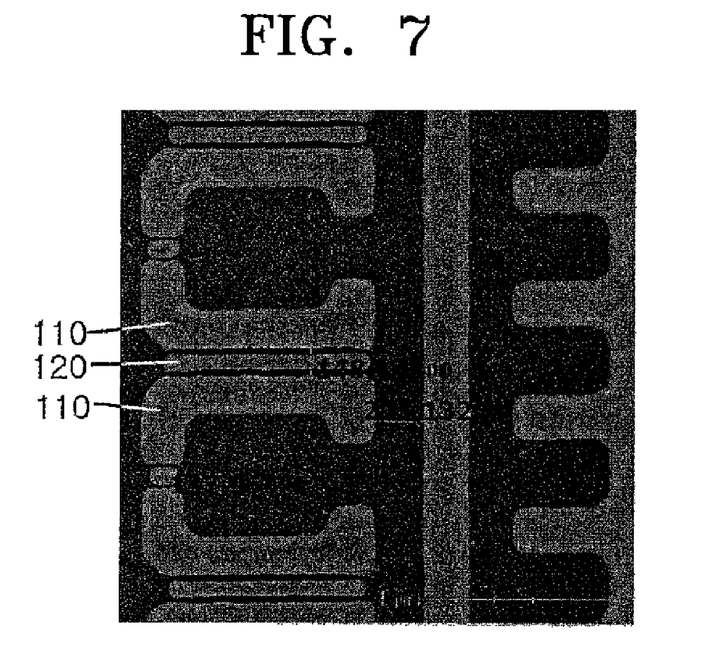
FIGS. 7 and 8 are SEM images illustrating top views of resulting structures including first hard mask patterns arranged in various layouts and second hard mask patterns formed in spacer regions each created between the first hard mask patterns according to still another embodiment of the invention.
Figure 8:
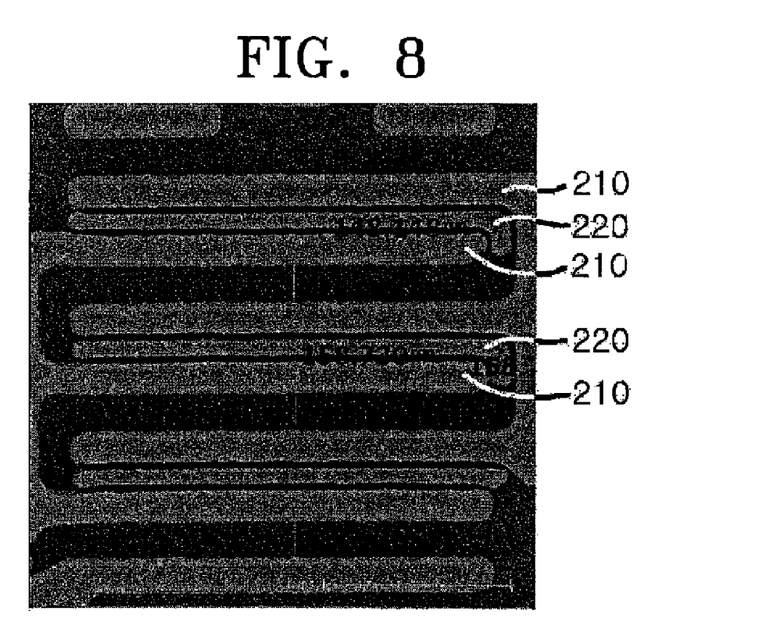

FIGS. 7 and 8 are SEM images illustrating top views of resulting structures including first hard mask patterns arranged in various layouts and second hard mask patterns formed in space regions defined between the first hard mask patterns according to still another embodiment of the present invention. In FIGS. 7 and 8, the first hard mask patterns are denoted with reference numerals 110 and 210, respectively, and the second hard mask patterns are denoted with reference numerals 120 and 220, respectively.

If a width of the space region between the two adjacent first hard mask patterns 110 or 210 is less than approximately 200 nm, the second hard mask patterns 120 or 220 are formed in such space regions. If the width of the space region is greater than approximately 200 nm, the second hard mask patterns are not formed in such space regions.

Figure 9:
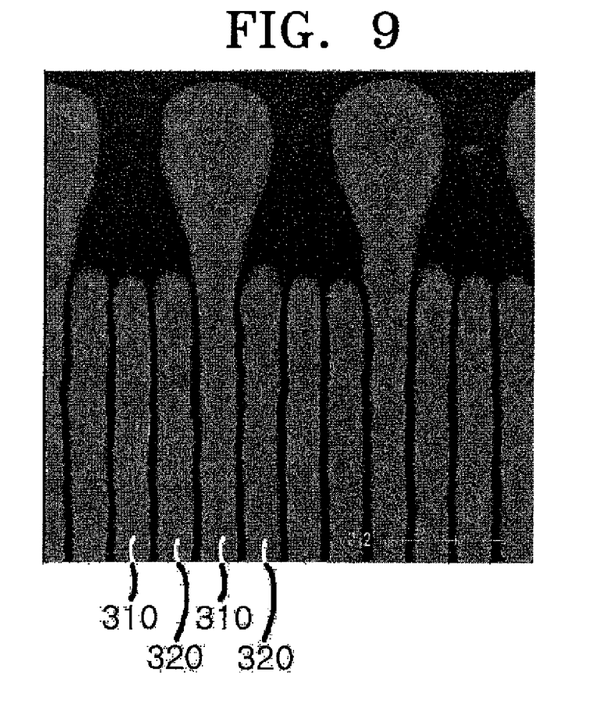
FIGS. 9 and 10 are SEM images illustrating top views of resulting substrate structures including first hard mask patterns arranged in various layouts and second hard mask patterns formed in spacer regions each created between the first hard mask patterns according to a further embodiment of the invention.
Figure 10:
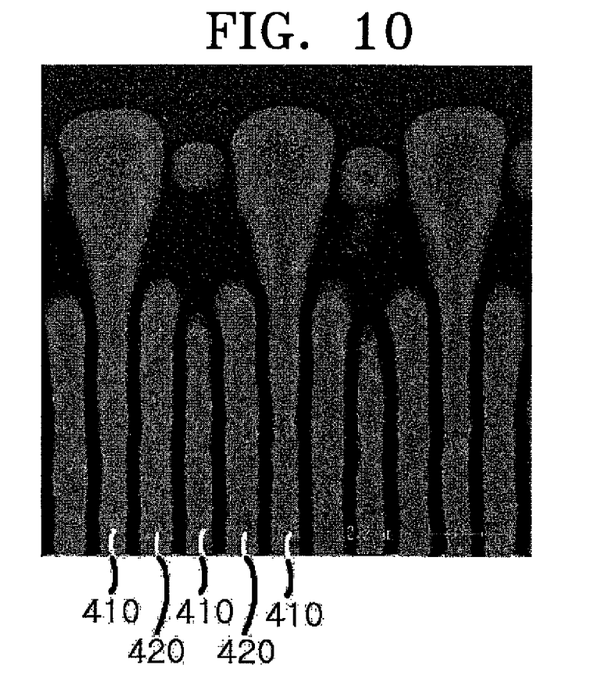

FIGS. 9 and 10 are SEM images illustrating top views of a resulting structure including first hard mask patterns arranged with various layouts and second hard mask patterns formed in space regions defined between the first hard mask patterns in accordance with a further embodiment of the present invention. In FIGS. 9 and 10, the first hard mask patterns are denoted with reference numerals 310 and 410, respectively, and the second hard mask patterns are denoted with reference numerals of 320 and 420, respectively.

Similar to the embodiment described in FIGS. 7 and 8, when a width of the space region is small, the second hard mask patterns 320 or 420 are formed in such space regions defined between two adjacent first hard mask patterns 310 or 410. If the width of the space region is large, the second hard mask patterns 320 or 420 are not formed in such space regions.

According to a fine pattern formation method of one embodiment of the invention, first hard mask patterns each with a pitch twice larger than that of an intended L/S pattern are formed on an etch target layer, and afterwards, the second hard mask patterns are formed in space regions defined between two adjacent first hard mask patterns. Therefore, it is possible to form the L/S patterns each having a pitch size that is approximately one half of the pitch that can be commonly realized by a conventional photolithography process. As a result, fine patterns, which can overcome resolution limitations in the conventional photolithography process, can be easily implemented. Also, since the patterns which have widely ranging pitches and widths can be formed simultaneously on the substrate by employing a simple patterning process, an additional patterning process is not necessarily performed according to a difference in the pattern density on the same substrate and widely ranging pitches and sizes of various patterns can be simultaneously formed without being affected by the pattern density difference. Being different from the conventional spacer formation method, the additional trimming process is not applied to separate edge parts from a main line type pattern and thus, a high-integration semiconductor fabrication method can be simplified.

While the present invention has been particularly shown and described with reference to exemplary embodiments thereof, it will be understood by those of ordinary skill in the art that various changes in form and details may be made therein without departing from the scope of the present invention as defined by the following claims.

What is claimed is:

1. A method of forming a fine pattern of a substrate, comprising:
   forming, as a first hard mask, a plurality of first line patterns on an etch target layer;
   forming a first layer on sidewalls of the first hard mask, such that the first layer delimits a recess between a pair of the first line patterns in a cell array region of a semiconductor device;
   forming, as a second hard mask, a plurality of second line patterns within the recess, such that each of the second line patterns is disposed between adjacent ones of a respective pair of the first line patterns;
   etching the first layer using the first line patterns and the second line patterns as an etch mask, to thereby expose that part of the etch target layer disposed between the first line patterns and the second line patterns; and
   patterning the etch target layer using the first hard mask and the second hard mask, to thereby form a fine pattern in the cell array region of the semiconductor device.

2. The method of claim 1, wherein the fine pattern is an active region in the cell array region of the semiconductor device.

3. The method of claim 1, wherein the first line patterns and the second line patterns are used to form a plurality of line and space patterns on the substrate.

4. The method of claim 1, wherein the forming of the second hard mask pattern comprises:
   forming a second layer on the first layer, the second layer having a different etch selectivity ratio from that of the first layer; and
   removing one portion of the second layer while leaving another portion of the second layer within the recess.

5. The method of claim 4, wherein the first layer is formed such that the first layer delimits at least one other recess between another pair of the first line patterns, and the removing of one portion of the second layer comprises removing the second layer completely from within said another recess.

6. The method of claim 5, wherein the second line patterns are formed within a group of recesses, respectively, delimited by the first layer in the cell array region of the semiconductor device.

7. The method of claim 1, wherein the fine pattern is a conductive pattern in the cell array region of the semiconductor device.

8. The method of claim 7, wherein the fine pattern is a gate electrode.

9. The method of claim 7, wherein the fine pattern is a bit line

10. A method of forming a fine pattern of a substrate, comprising:
    forming a first hard mask pattern comprising a plurality of first line patterns formed in a first area and a second area over an etch target layer;
    forming a first layer on sidewalls of the first hard mask pattern in the first area and the second area, such that the first layer includes a top surface having a plurality of recesses, each being formed between two adjacent first line patterns;
    forming a second hard mask pattern comprising a plurality of second line patterns within the recesses in the second area;
    performing an etching process on the first layer using the first line patterns and the second line patterns as an etch mask, thereby exposing the etch target layer disposed between the two adjacent first line patterns in the first area and exposing the etch target layer disposed between the first line patterns and the second line patterns in the second area; and
    patterning the etch target layer using the first hard mask pattern in the first area and using the first hard mask pattern and the second hard mask pattern in the second area.

11. The method of claim 10, wherein the plurality of first line patterns of the first hard mask pattern includes a first group of the first line patterns formed in the first region with a first pitch and a second group of the first line patterns formed in the second region with a second pitch, and wherein patterning the etch target layer defines first fine patterns with the first pitch in the first region and the second fine patterns with a third pitch that is smaller than the second pitch in the second area.

12. The method of claim 10, wherein the second hard mask pattern is formed at the same surface level as the first hard mask pattern over the etch target layer.

13. The method of claim 10, wherein the first hard mask pattern and the second hard mask pattern are formed of the same material.

14. The method of claim 10, wherein the first area forms a peripheral region or a core region of a semiconductor device, and wherein the second area forms a cell array region of the semiconductor device.

15. The method of claim 14, wherein patterning the etch target layer defines active regions of the semiconductor device in the first area and the second area.

16. The method of claim 10, wherein patterning the etch target layer defines conductive patterns in the first area and the second area.

17. The method of claim 16, wherein the conductive patterns form gate electrodes in the second area.

18. The method of claim 16, wherein the conductive patterns form bit lines in the second area.

19. The method of claim 10, wherein the forming of the second hard mask pattern comprises:
    forming a second layer on the first layer in the first region and the second region, the second layer having a different etch selectivity ratio from that of the first layer; and
    forming the second line patterns from remaining portions of the second layer within the recess in the second region by removing portions of the second layer in the first region and the second region.

20. The method of claim 19, wherein the second layer is completely removed within the recesses in the first region during the removal of the portions of the second layer.

* * * * *